US012268098B2

(12) United States Patent
Chu et al.

(10) Patent No.: US 12,268,098 B2
(45) Date of Patent: *Apr. 1, 2025

(54) MAGNETORESISTIVE RANDOM ACCESS MEMORY HAVING A RING OF MAGNETIC TUNNELING JUNCTION REGION SURROUNDING AN ARRAY REGION

(71) Applicant: UNITED MICROELECTRONICS CORP., Hsin-Chu (TW)

(72) Inventors: Chung-Liang Chu, Kaohsiung (TW); Jian-Cheng Chen, New Taipei (TW); Yu-Ping Wang, Hsinchu (TW); Yu-Ruei Chen, New Taipei (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/528,707

(22) Filed: Dec. 4, 2023

(65) Prior Publication Data

US 2024/0107895 A1 Mar. 28, 2024

Related U.S. Application Data

(63) Continuation of application No. 18/108,003, filed on Feb. 9, 2023, now Pat. No. 11,877,520, which is a
(Continued)

(30) Foreign Application Priority Data

Jun. 8, 2018 (CN) .......................... 201810586453.5

(51) Int. Cl.
*H10N 50/80* (2023.01)
*G11C 11/16* (2006.01)
(Continued)

(52) U.S. Cl.
CPC .......... *H10N 50/80* (2023.02); *G11C 11/161* (2013.01); *H01L 27/0207* (2013.01); *H10B 61/22* (2023.02)

(58) Field of Classification Search
CPC ...... H10N 50/80; G11C 11/161; H10B 61/22; H01L 27/0207
(Continued)

(56) References Cited

U.S. PATENT DOCUMENTS 8,614,912 B2 12/2013 Lee et al.
10,193,060 B2 1/2019 Han
(Continued)

FOREIGN PATENT DOCUMENTS

CN 101288150 A 10/2008
CN 102201533 A 9/2011
(Continued)

*Primary Examiner* — Hoai V Pham
(74) *Attorney, Agent, or Firm* — Winston Hsu

(57) ABSTRACT

A semiconductor device includes a substrate having an array region defined thereon, a ring of magnetic tunneling junction (MTJ) region surrounding the array region, a gap between the array region and the ring of MTJ region, and metal interconnect patterns overlapping part of the ring of MTJ region. Preferably, the array region includes a magnetic random access memory (MRAM) region and a logic region and the ring of MTJ region further includes a first MTJ region and a second MTJ region extending along a first direction and a third MTJ region and a fourth MTJ region extending along a second direction.

16 Claims, 4 Drawing Sheets

Related U.S. Application Data continuation of application No. 17/182,146, filed on Feb. 22, 2021, now Pat. No. 11,611,035, which is a continuation of application No. 16/731,064, filed on Dec. 31, 2019, now Pat. No. 10,971,676, which is a continuation of application No. 16/029,641, filed on Jul. 8, 2018, now Pat. No. 10,566,520.

(51) Int. Cl.
*H01L 27/02* (2006.01)
*H10B 61/00* (2023.01)

(58) Field of Classification Search
USPC .................................................. 257/414, 421
See application file for complete search history.

(56) References Cited

U.S. PATENT DOCUMENTS

| | | | |
|---|---|---|---|
| 10,971,676 B2 | 4/2021 | Chu | |
| 11,877,520 B2 * | 1/2024 | Chu | ............... G11C 11/161 |
| 2002/0075718 A1 | 6/2002 | Bohm | |
| 2013/0171742 A1 | 7/2013 | Wang | |
| 2017/0170386 A1 | 6/2017 | Chuang | |

FOREIGN PATENT DOCUMENTS

| | | |
|---|---|---|
| CN | 105206741 A | 12/2015 |
| CN | 106340540 A | 1/2017 |
| WO | 2016/200510 | 12/2016 |

* cited by examiner

MAGNETORESISTIVE RANDOM ACCESS MEMORY HAVING A RING OF MAGNETIC TUNNELING JUNCTION REGION SURROUNDING AN ARRAY REGION

CROSS REFERENCE TO RELATED APPLICATIONS

This application is a continuation application of U.S. application Ser. No. 18/108,003, filed on Feb. 9, 2023, which is a continuation application of U.S. application Ser. No. 17/182,146, filed on Feb. 22, 2021, which is a continuation application of U.S. application Ser. No. 16/731,064, filed on Dec. 31, 2019, which is a continuation application of U.S. application Ser. No. 16/029,641, filed on Jul. 8, 2018. The contents of these applications are incorporated herein by reference.

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes a substrate having an array region defined thereon, a ring of magnetic tunneling junction (MTJ) region surrounding the array region, a gap between the array region and the ring of MTJ region, and metal interconnect patterns overlapping part of the ring of MTJ region. Preferably, the array region includes a magnetic random access memory (MRAM) region and a logic region and the ring of MTJ region further includes a first MTJ region and a second MTJ region extending along a first direction and a third MTJ region and a fourth MTJ region extending along a second direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
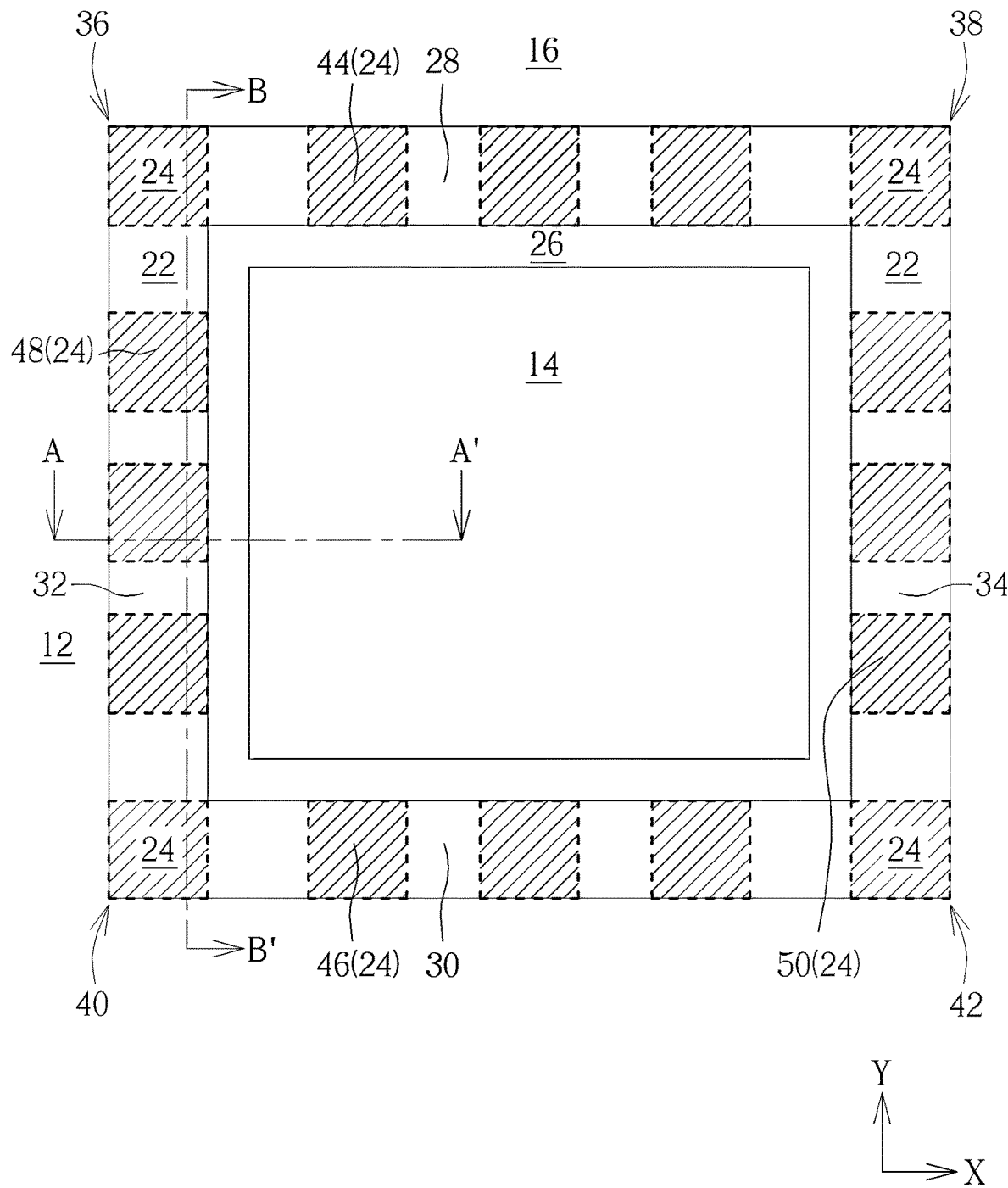
FIG. 1 illustrates a top view of a MRAM device according to an embodiment of the present invention.
Figure 2:
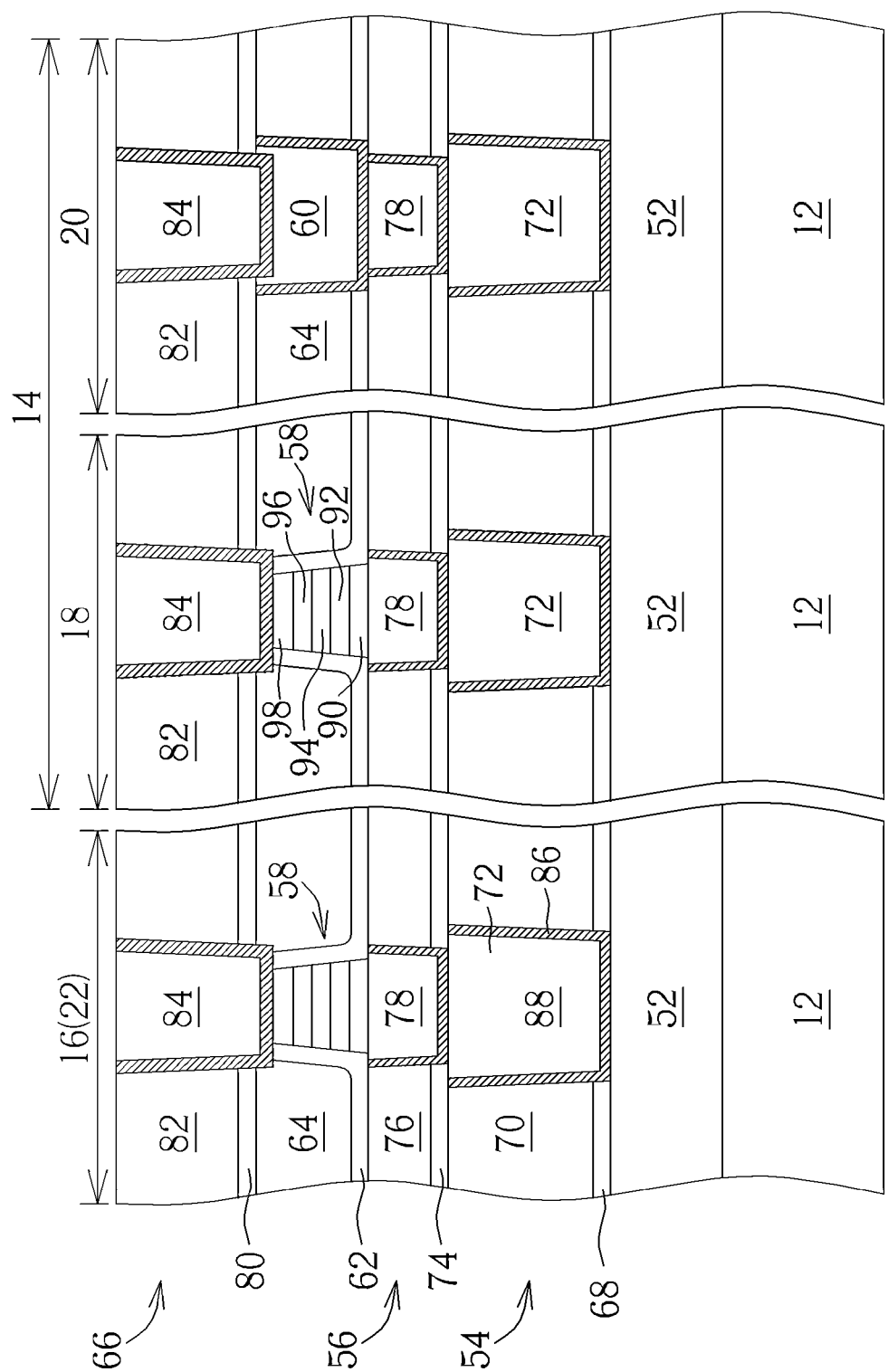
FIG. 2 illustrates a cross-section of the MRAM device along the sectional line AA' of FIG. 1.
Figure 3:
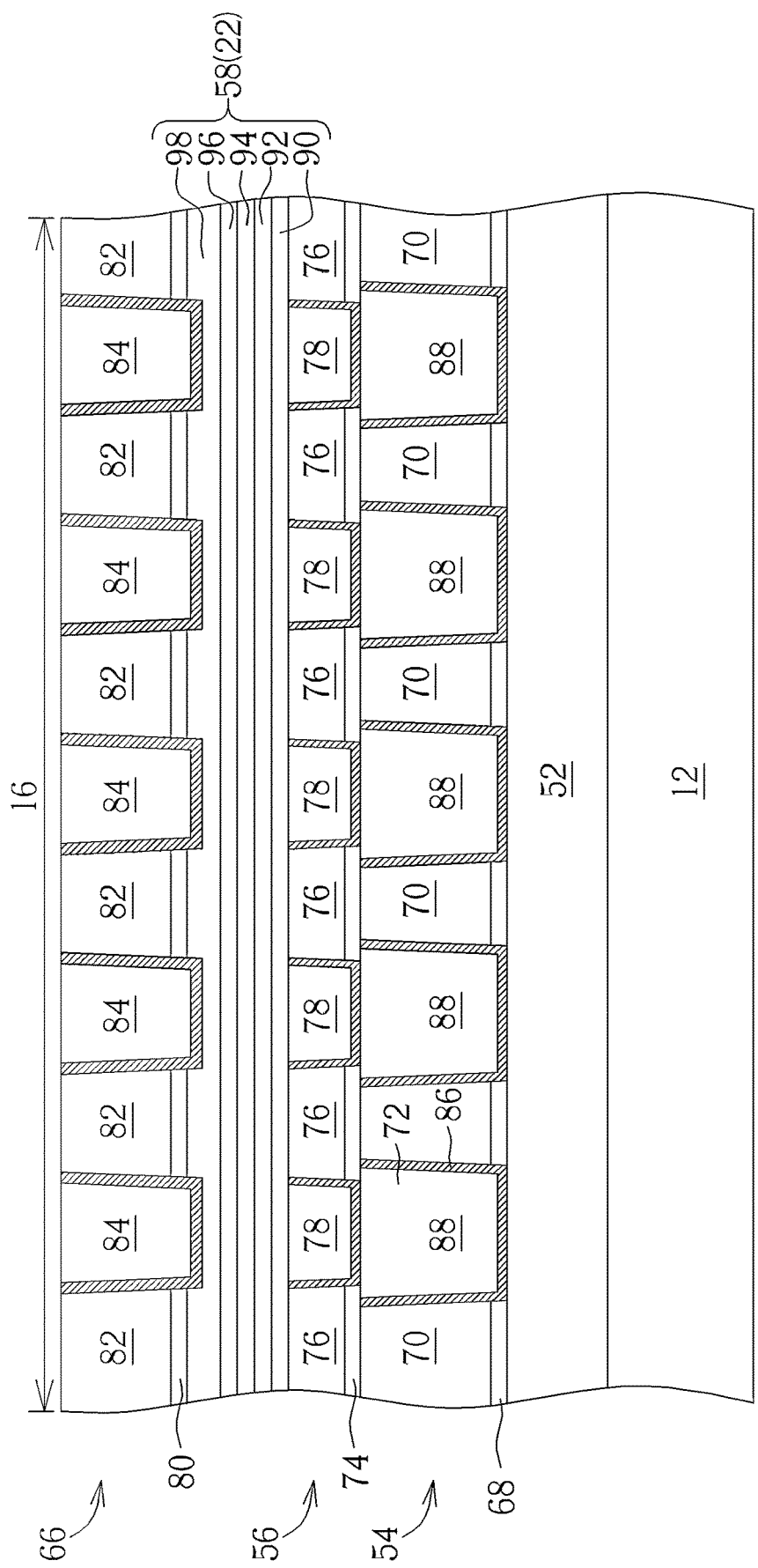
FIG. 3 illustrates a cross-section of the MRAM device along the sectional line BB' of FIG. 1.

Referring to FIGS. 1-3, FIG. 1 illustrates a top view of a semiconductor device, or more specifically a MRAM device according to an embodiment of the present invention, FIG. 2 illustrates a cross-section of the MRAM device along the sectional line AA' of FIG. 1, and FIG. 3 illustrates a cross-section of the MRAM device along the sectional line BB' of FIG. 1. As shown in FIGS. 1-3, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). An array region 14 and a periphery region 16 surrounding the array region 14 are defined on the substrate 12, in which the array region 14 in this embodiment could also be referred to as a MRAM macro region. The array region 14 could further include a MRAM region 18 and a logic region 20 while the periphery region 16 could include at least a ring of MTJ region 22 surrounding the array region 14.

Viewing from a more detailed perspective, the MRAM unit shown in FIG. 1 also includes a plurality of metal interconnect patterns 24 overlapping part of the MTJ region 22 and a gap 26 disposed between the array region 14 and the ring of MTJ region 22 so that the ring of MTJ region 22 does not contact the array region 14 directly. In this embodiment, the MTJ region 22 surrounding the array region 14 further includes a first MTJ region 28 and a second MTJ region 30 extending along a first direction (such as X-direction) and a third MTJ region 32 and a fourth MTJ region 34 extending along a second direction (such as Y-direction), in which the first MTJ region 28 overlaps the third MTJ region 32 at a first corner 36, the first MTJ region 28 overlaps the fourth MTJ region 34 at a second corner 38, the second MTJ region 30 overlaps the third MTJ region 32 at a third corner 40, and the second MTJ region 30 overlaps the fourth MTJ region 34 at a fourth corner 42.

In other words, the first MTJ region 28, the second MTJ region 30, the third MTJ region 32, and the fourth MTJ region 34 together constitute a square-shaped or rectangular-shaped ring surrounding the array region 14 and the metal interconnect patterns 24 overlap each of the first MTJ region 28, the second MTJ region 30, the third MTJ region 32, and the fourth MTJ region 34, including the metal interconnect patterns 44 overlap the first MTJ region 28, the metal interconnect patterns 46 overlap the second MTJ region 30, the metal interconnect patterns 48 overlap the third MTJ region 32, and the metal interconnect patterns 50 overlap the fourth MTJ region 34.

In this embodiment, each of the metal interconnect patterns 24 includes a square or rectangle and the metal interconnect patterns 24 not only overlap the first MTJ region 28, the second MTJ region 30, the third MTJ region 32, and the fourth MTJ region 34 surrounding the array region 14 but also overlap the four corners including the first corner 36, the second corner 38, the third corner 40, and the fourth corner 42. It should be noted that despite only three metal interconnect patterns 24 are shown to overlap each of the first MTJ region 28, the second MTJ region 30, the third MTJ region 32, and the fourth MTJ region 34, according to an embodiment of the present invention, it would also be desirable to adjust the number of the metal interconnect patterns 24 overlapping the MTJ regions 28, 30, 32, 34. For instance, it would be desirable to dispose only one or more than one metal interconnect patterns 24 on each of the first MTJ region 28, the second MTJ region 30, the third MTJ region 32, and the fourth MTJ region 34, which are all within the scope of the present invention.

Moreover, it should be noted that even though each of the metal interconnect patterns 24 in this embodiment preferably share equal size such as equal lengths and equal widths, according to an embodiment of the present invention, it would also be desirable to adjust the sizes of the metal interconnect patterns 24 so that the metal interconnect patterns 24 could have different lengths and/or different widths. For instance, the metal interconnect patterns 24 overlapping the four corners could include a first size and the metal interconnect patters 44, 46, 48, 50 overlapping the first MTJ region 28, the second MTJ region 30, the third MTJ region 32, and the fourth MTJ region 34 could include a second size that is different from the first size, in which the definition of different size in this embodiment could refer to same lengths and different widths or same widths and different lengths, which are all within the scope of the present invention.

According to yet another embodiment of the present invention, the metal interconnect patterns 24 could also be disposed to only overlap the first MTJ region 28, the second MTJ region 30, the third MTJ region 32, and the fourth MTJ region 34 enclosing the array region 14 but not overlapping the four corners including the first corner 36, the second corner 38, the third corner 40, and the fourth corner 42, which is also within the scope of the present invention.

As shown in the cross-section views in FIGS. 2-3, active devices such as metal-oxide semiconductor (MOS) transistors, passive devices, conductive layers, and interlayer dielectric (ILD) layer 52 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacers, epitaxial layers, and contact etch stop layer (CESL). The ILD layer 52 could be formed on the substrate 12 to cover the MOS transistors, and a plurality of contact plugs (not shown) could be formed in the ILD layer 52 to electrically connect to the gate structure and/or source/drain region of MOS transistors. Since the fabrication of planar or non-planar transistors and ILD layer is well known to those skilled in the art, the details of which are not explained herein for the sake of brevity.

The semiconductor device also includes metal interconnect structures 54, 56 disposed on the ILD layer 52, MTJs 58 disposed on metal interconnect structure 56 on the periphery region 16 and the MRAM region 18, metal interconnection 60 disposed on the metal interconnect structure 56 on the logic region 20, cap layer 62 disposed on sidewalls of the MTJs 58, inter-metal dielectric (IMD) layer 64 disposed around the cap layer 62, and another metal interconnect structure 66 disposed on the MTJs 58 and the metal interconnection 60.

In this embodiment, the metal interconnect structure 54 includes a stop layer 68, an IMD layer 70, and a plurality of metal interconnections 72 embedded within the stop layer 68 and the IMD layer 70, the metal interconnect structure 56 includes a stop layer 74, an IMD layer 76, and a plurality of metal interconnections 78 embedded in the stop layer 74 and the IMD layer 76, and the metal interconnect structure 66 includes a stop layer 80, an IMD layer 82, and metal interconnections 84 embedded in the stop layer 80 and the IMD layer 82.

In this embodiment, each of the metal interconnections 72, 78, 84 within the metal interconnect structures 54, 56, 66 and the metal interconnection 60 could be fabricated according to a single damascene or dual damascene process. For instance, each of the metal interconnections 72 preferably include a trench conductor, each of the metal interconnections 78 preferably include a via conductor, each of the metal interconnections 84 preferably include a via conductor, and the metal interconnection 60 preferably includes a trench conductor.

Moreover, each of the metal interconnections 72, 78, 84 could further includes a barrier layer 86 and a metal layer 88, in which the barrier layer 86 could be selected from the group consisting of titanium (Ti), titanium nitride (TiN), tantalum (Ta), and tantalum nitride (TaN) and the metal layer 88 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 88 are preferably made of copper, the IMD layers 70, 76, 82 are preferably made of silicon oxide, and the stop layers 68, 74, 80 are preferably made of nitrogen doped carbide (NDC), silicon nitride, silicon carbon nitride (SiCN), or combination thereof.

In this embodiment, the formation of the MTJs 58 could be accomplished by sequentially forming a first electrode layer 90, a fixed layer 92, a free layer 94, a capping layer 96, and a second electrode layer 98 on the IMD layer 76. In this embodiment, the first electrode layer 90 and the second electrode layer 98 are preferably made of conductive material including but not limited to for example Ta, Pt, Cu, Au, Al, or combination thereof. The fixed layer 92 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 92 is formed to fix or limit the direction of magnetic moment of adjacent layers. The free layer 94 could be made of ferromagnetic material including but not limited to for example iron, cobalt, nickel, or alloys thereof such as cobalt-iron-boron (CoFeB), in which the magnetized direction of the free layer 94 could be altered freely depending on the influence of outside magnetic field. The capping layer 96 could be made of insulating material including but not limited to for example oxides such as aluminum oxide ($AlO_x$) or magnesium oxide (MgO).

Next, a pattern transfer or photo-etching process is conducted by using a patterned resist (not shown) as mask to remove part of the second electrode layer 98, part of the capping layer 96, part of the free layer 94, part of the fixed layer 92, and part of the first electrode layer 90 to form MTJs 58 on the periphery region 16 and the MRAM region 18, in which each of the MTJs 58 electrically connect or more specifically directly contact the metal interconnections 78 underneath.

It should be noted that even though the bottom surfaces of the MTJs 58 on the periphery region 16 and the MRAM region 18 all contact the metal interconnections 78 directly, only the MTJs 58 on the MRAM region 18 would connect to active devices such as MOS transistors disposed on the surface of the substrate 12. In other words, the metal interconnection 78 or metal interconnection 72 connected to the MTJ 58 on the MRAM region 18 are further connected to MOS transistors on the surface of the substrate 12 while the metal interconnections 72, 78 connected to the MTJ 58 on the periphery region 16 function as dummy metal interconnections are not connected to other wires or metal interconnections underneath.

It should further be noted that the metal interconnections such as the metal interconnection 78 and/or metal interconnection 72 are in fact the metal interconnect patterns 24 overlapping the MTJ region 22 shown in FIG. 1 and the MTJ 58 disposed on the periphery region 16 shown in FIG. 3 if viewed from the top would share same shape as the MTJ region 22. In other words, the MTJ 58 on the periphery region 16 if viewed from the top would appear as a circular ring or rectangular ring surrounding the entire array region 14. In contrast to the MTJ 58 on the periphery region 16 surrounding the entire array region 14 in a circular ring or rectangular ring, the MTJ 58 on the MRAM region 18 if viewed from the top would include a shape different from the MTJ 58 on the periphery region 16. Specifically, the MTJ 58 or MTJs 58 on the MRAM region 18 could appear as individual MTJs arranged according to an array while each of the independent MTJs 58 on the MRAM region 18 could include but not limited to for example a rectangle.

Figure 4:
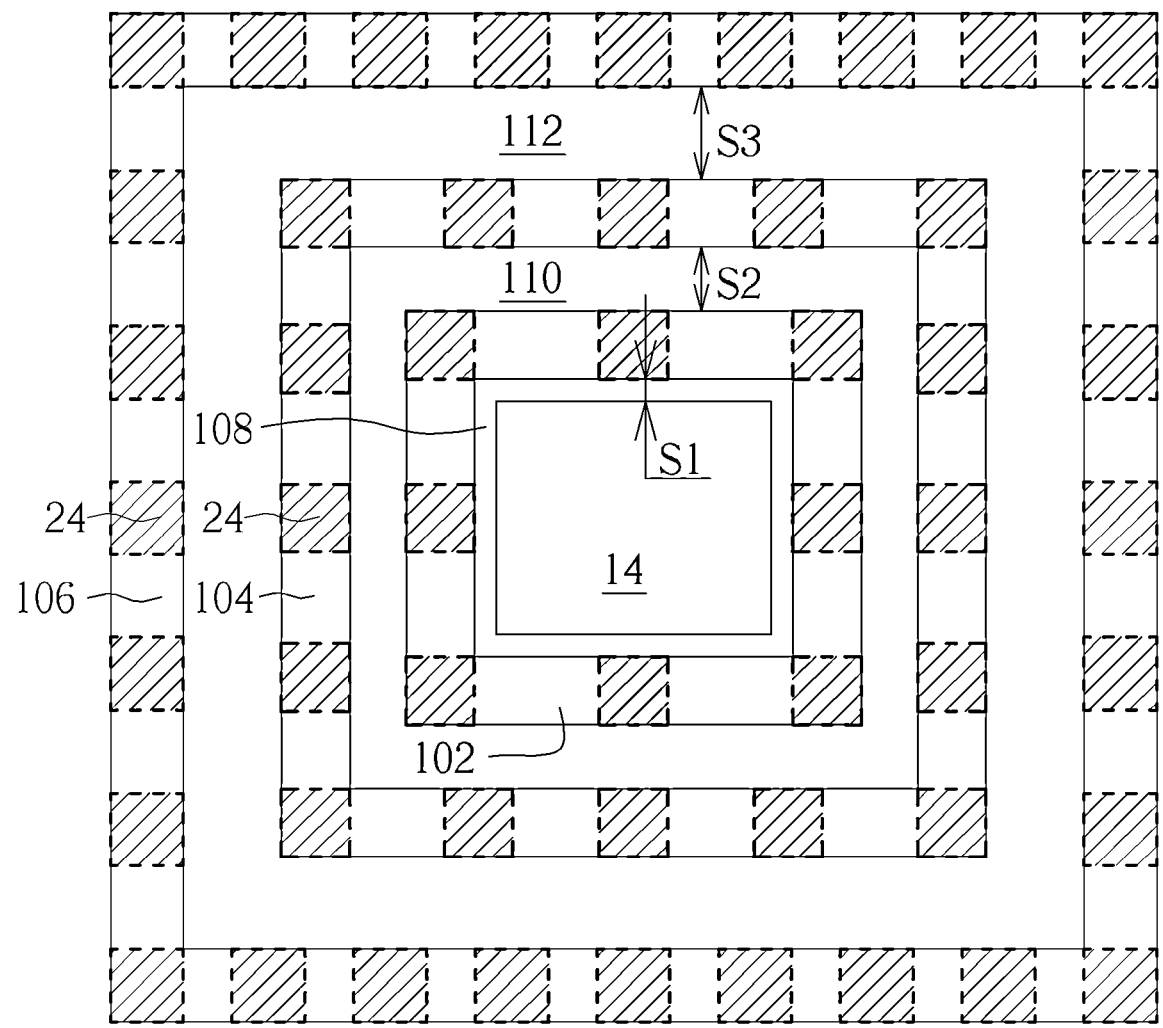
FIG. 4 illustrates a top view of a MRAM device according to an embodiment of the present invention.

Referring to FIG. 4, FIG. 4 illustrates a top view of a MRAM device according to an embodiment of the present invention. As shown in FIG. 4, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). An array region 14 and a periphery region 16 surrounding the array region 14 are defined on the substrate 12. Similar to the aforementioned embodiment, the array region 14 in this embodiment could also be referred to as a MRAM macro region and the array region 14 could further include a MRAM region and a logic region while the periphery region 16 could include MTJ regions surrounding the array region 14.

In contrast to the aforementioned embodiment of only placing a ring of MTJ region around the array region 14, at least three rings of MTJ regions are disposed around the array region 14. Preferably, a first ring of MTJ region 102 is disposed around the array region 14, a second ring of MTJ region 104 is disposed around the first ring of MTJ region 102, and a third ring of MTJ region 106 is disposed around the second ring of MTJ region 104, in which gaps are formed between the MTJ regions 102, 104, 106 and the array region 14 so that the regions do not contact each other directly. For instance, a first gap 108 is disposed between the array region 14 and the first ring of MTJ region 102, a second gap 110 is disposed between the first ring of MTJ region 102 and the second ring of MTJ region 104, and a third gap 112 is disposed between the second ring of MTJ region 104 and the third ring of MTJ region 106.

In this embodiment, the distance between the array region 14 and the MTJ region 102 is preferably different from the distance between the MTJ regions 102, 104, 106. For instance, the distance S1 (also referred to as the width of the first gap 108) between the array region 14 and the first ring of MTJ region 102 is preferably less than the distance S2 (also referred to as the width of the second gap 110) between the first ring of MTJ region 102 and the second ring of MTJ region 104, and the distance S2 between the first ring of MTJ region 102 and the second ring of MTJ region 104 is also less than the distance S3 (also referred to as the width of the third gap 112) between the second ring of MTJ region 104 and the third ring of MTJ region 106.

Similar to the aforementioned embodiment, the MRAM unit shown in FIG. 4 also includes multiple metal interconnect patterns 24 overlapping part of the MTJ regions 102, 104, 106, in which each of the metal interconnect patterns 24 preferably include a square or rectangle, and the metal interconnect patterns 24 not only overlap the MTJ regions 102, 104, 106 surrounding the array region 14 but could also choose to overlap or not overlap the four corners, which are all within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate having an array region defined thereon, wherein the array region comprises a magnetic random access memory (MRAM) region and a logic region;
    a ring of magnetic tunneling junction (MTJ) region surrounding the array region;
    a gap between the array region and the ring of MTJ region;
    metal interconnect patterns overlapping part of the ring of MTJ region and connected to a bottom surface of the ring of MTJ region; and
    metal interconnections connected to a top surface of the ring of MTJ region.

2. The semiconductor device of claim 1, wherein the ring of MTJ region comprises:
    a first MTJ region and a second MTJ region extending along a first direction; and
    a third MTJ region and a fourth MTJ region extending along a second direction.

3. The semiconductor device of claim 2, wherein the first MTJ region overlaps the third MTJ region at a first corner, the first MTJ region overlaps the fourth MTJ region at a second corner, the second MTJ region overlaps the third MTJ region at a third corner, and the second MTJ region overlaps the fourth MTJ region at a fourth corner.

4. The semiconductor device of claim 3, wherein each of the metal interconnect patterns comprises a square or rectangle.

5. The semiconductor device of claim 4, wherein one of the metal interconnect patterns overlap the first corner.

6. The semiconductor device of claim 5, wherein one of the metal interconnect patterns overlap the second corner.

7. The semiconductor device of claim 6, wherein one of the metal interconnect patterns overlap the third corner.

8. The semiconductor device of claim 7, wherein one of the metal interconnect patterns overlap the fourth corner.

9. The semiconductor device of claim 1, wherein the ring of MTJ region comprises a first MTJ on the substrate.

10. The semiconductor device of claim 9, wherein the metal interconnect patterns comprise:
   a first metal interconnection under the first MTJ; and
   a second metal interconnection under the first metal interconnection.

11. The semiconductor device of claim 10, further comprising:
   a second MTJ on the MRAM region;
   a third metal interconnection under the second MTJ; and
   a fourth metal interconnection under the third metal interconnection.

12. The semiconductor device of claim 11, wherein bottom surfaces of the first MTJ and the second MTJ are coplanar.

13. The semiconductor device of claim 11, wherein bottom surfaces of the first metal interconnection and the third metal interconnection are coplanar.

14. The semiconductor device of claim 11, further comprising:
   a fifth metal interconnection on the logic region;
   a sixth metal interconnection under the fifth metal interconnection; and
   a seventh metal interconnection under the sixth metal interconnection.

15. The semiconductor device of claim 14, wherein bottom surfaces of the first MTJ and the fifth metal interconnection are coplanar.

16. The semiconductor device of claim 14, wherein bottom surfaces of the second MTJ and the fifth metal interconnection are coplanar.

* * * * *